United States Patent [19]
Fujinuma

[11] Patent Number: 5,844,819
[45] Date of Patent: Dec. 1, 1998

[54] METHOD AND APPARATUS FOR AIDING DESIGN OF MECHANISM

[75] Inventor: Tomohisa Fujinuma, Sagamihara, Japan

[73] Assignee: Kabushiki Kaisha Toshiba, Kawasaki, Japan

[21] Appl. No.: 715,590

[22] Filed: Sep. 18, 1996

[30] Foreign Application Priority Data

Sep. 19, 1995 [JP] Japan .................................. 7-240276

[51] Int. Cl.[6] .................................................. G06F 9/455
[52] U.S. Cl. ........................................ 364/578; 395/500
[58] Field of Search .............................. 395/500; 364/578

[56] References Cited

U.S. PATENT DOCUMENTS 5,140,537 8/1992 Tullis ........................................ 364/578
5,173,869 12/1992 Sakamoto et al. ...................... 395/500
5,335,339 8/1994 Maejima et al. ........................ 395/500

Primary Examiner—Kevin J. Teska
Assistant Examiner—Tyrone V. Walker
Attorney, Agent, or Firm—Oblon, Spivak, McClelland, Maier & Neustadt, P.C.

[57] ABSTRACT

There is provided an apparatus for aiding mechanism design such that mechanism design is aided by performing simulations of mechanism operations, the apparatus comprising a section for generating mechanism operation simulation data in accordance with predetermined data relating to a mechanism operation of a subject to be verified, a section for generating a time chart of the mechanism operation of the subject to be verified in accordance with the generated mechanism operation simulation data, and a section for displaying the generated time chart on a screen.

13 Claims, 11 Drawing Sheets

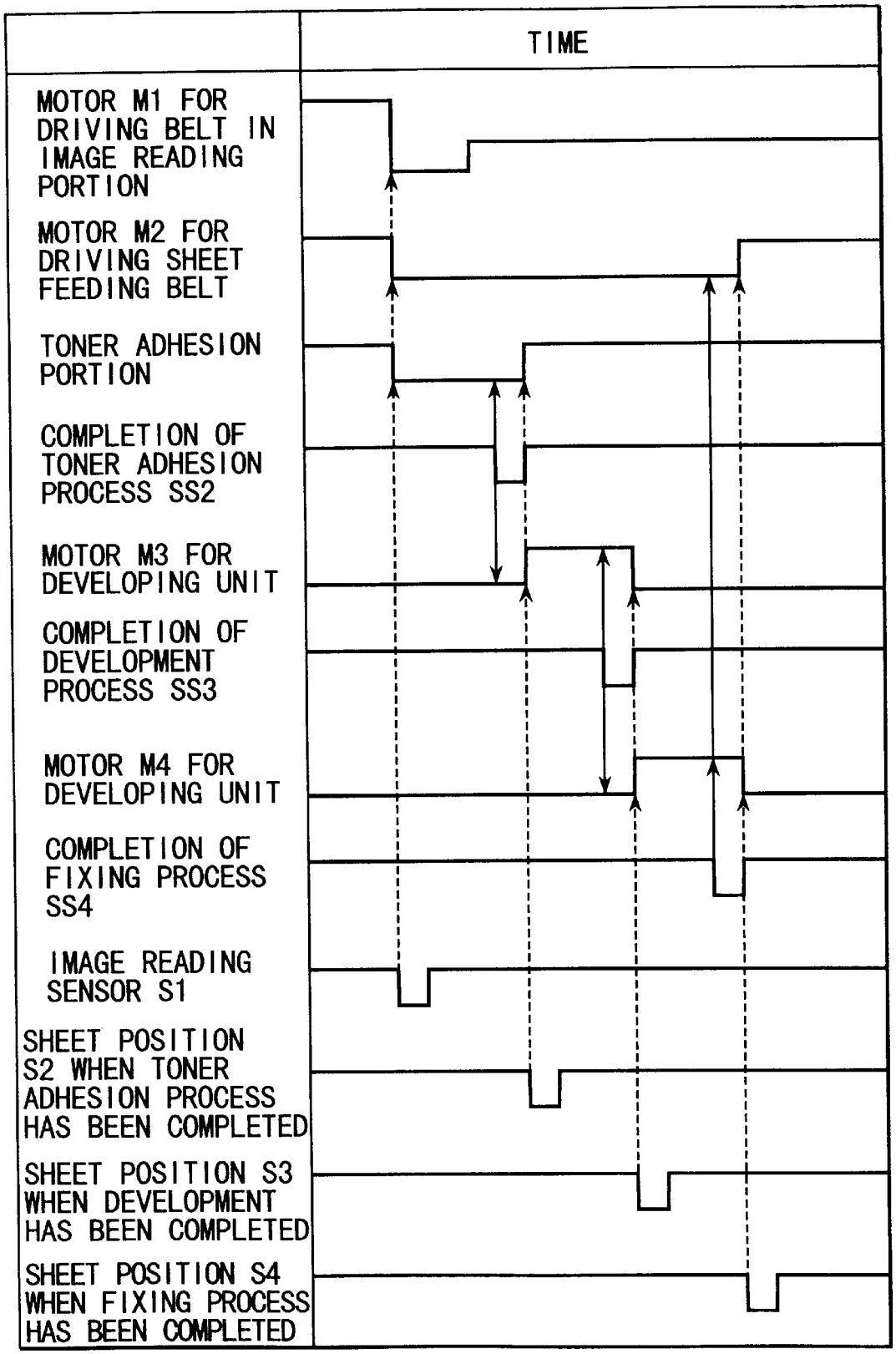
F I G. 4

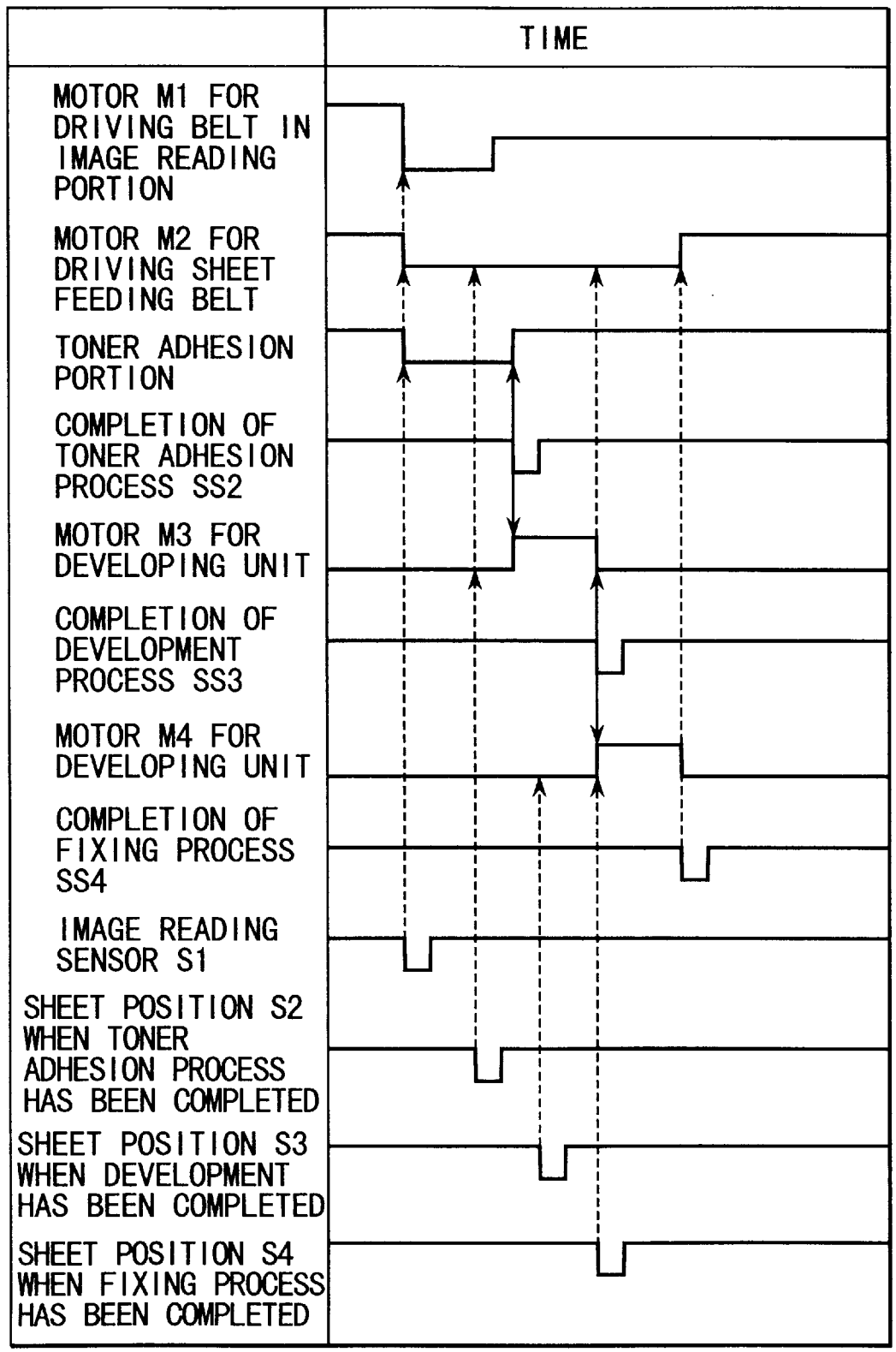
F I G. 9

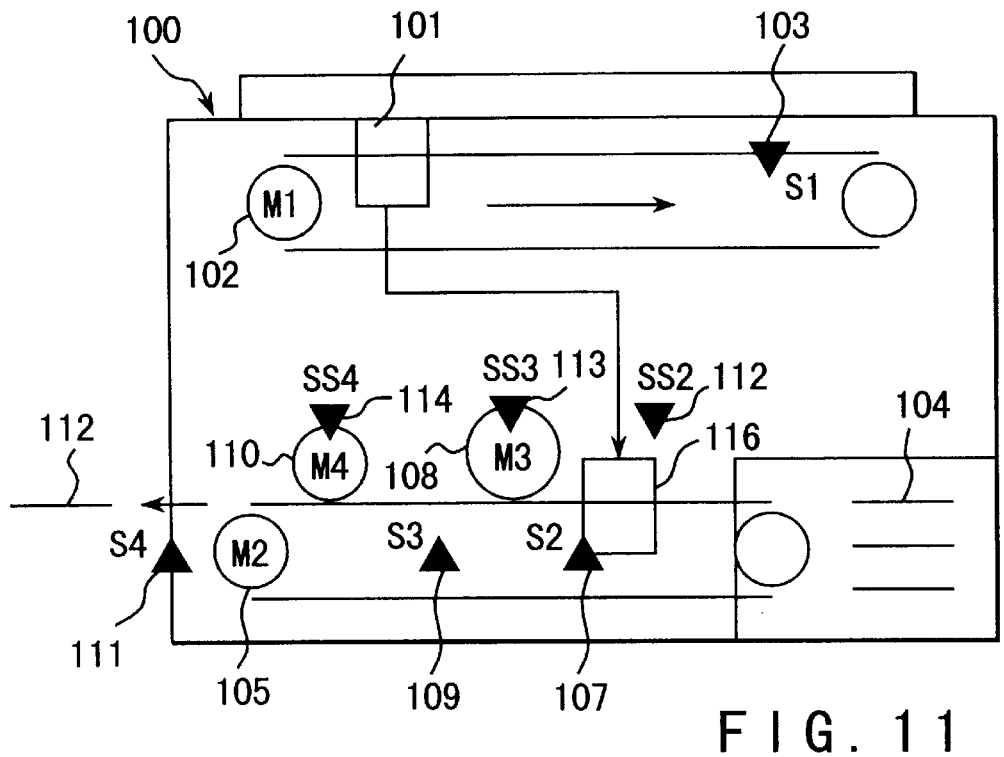
F I G. 11
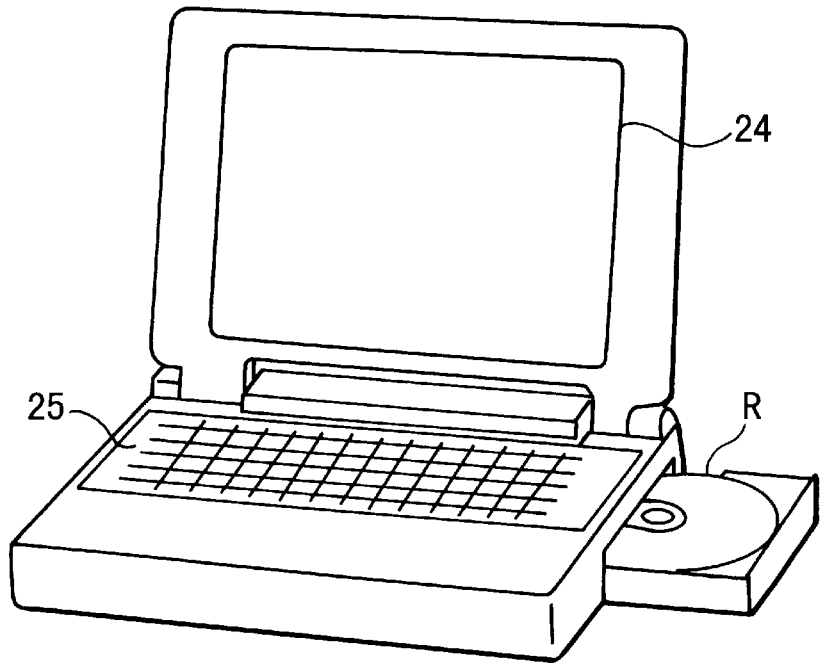
F I G. 12

METHOD AND APPARATUS FOR AIDING DESIGN OF MECHANISM

BACKGROUND OF THE INVENTION

1. Field of the Invention

The present invention relates to a method and an apparatus for aiding design of a mechanism by performing simulations of mechanism operations.

2. Description of the Related Art

As has been known, a variety of apparatuses each including machine elements, drive elements and sensor elements have been manufactured such that conceptual design is performed after required specifications have been determined, and then detailed design is performed and, during the detailed design process, the mechanism design is performed.

During the process of the mechanism design, drawings of an assembled state are produced from drawings of machine elements. On the assembly drawings, designers perform verification of operations while considering the relationship among the machine elements. Adjustment of the operations of the mechanism portions and adjustment of timing are generally performed when an experiment of a manufactured experimental machine is performed.

However, the mechanism design method, in which the designer verifies the operation on the drawings, involves frequent mistakes in judgment and a great labor and excessively long time are required. On the other hand, the method in which the verification of the operation is performed after the experimental machine has been manufactured, time required to develop the required machine cannot be shortened.

To solve the above-mentioned problems, the mechanism design has been on a trend that an apparatus for aiding mechanism design using the determination function of a computer is employed.

An apparatus for aiding mechanism design of the foregoing type is usually structured as shown in FIG. 1. That is, a machine operation reading unit 1 is operated to input machine constraint data of a subject apparatus, drive data of the mechanism operation and timing data to a mechanism operation simulation data generating portion 3 in a body 2 of the aiding apparatus.

Machine constraint data is fixed data, such as data of the distance from an initial position of each section to the position of a sensor, while drive data includes rotational speed data, acceleration and deceleration data when the operation of the apparatus is started and interrupted. Timing data is data on a sequence of operation timing.

The mechanism operation simulation data generating portion 3 generates mechanism operation simulation data consisting of machine constraint data and drive function data. The drive function is a function representing a state of operation with respect to a lapse of time. Generated mechanism operation simulation data is stored in a data file 4.

When an execution command is issued, a mechanism operation simulation execution portion 5 calls mechanism operation simulation data from the data file 4. The mechanism operation simulation execution portion 5 uses called data to perform a process shown in FIG. 2.

That is, when mechanism operation simulation data is called (step 11), the simulation of the operation of the mechanism is performed for each time step in accordance with called data (step 12). Then, time history position information of mechanism elements and data on the distances and angles between the sensor elements and operation elements, which are results of the simulation of the operation of the mechanism, are stored in the data file 4 (step 13). The simulation of the operation of the mechanism in step 12 is repeated until the mechanism operation time instructed by an operator has elapsed (step 14).

After the final simulation of the operation of the mechanism has been completed, image data formed into a table expressing the mechanism operation is generated (step 15), generated image data being displayed on an image output unit 6. The process in step 15 is performed by an image output data processing portion 7.

While observing the image displayed on the image output unit 6, the operator confirms the mechanism operation and timing operation considered during the mechanism design process. In a case where the operator requires to change the mechanism operation conditions, conditions for the timing operation required due to the delay in control and error processing conditions to again verify the mechanism design (step 16), mechanism operation simulation data is replaced through the machine operation reading unit 1 and new data is stored in the data file 4 (step 17) so that the simulation of the operation of the mechanism is again performed. The data replacement in step 17 is performed by the operator.

Note that the body 4 of the aiding apparatus is provided with a list output data processing portion 9 for causing the printing unit 8 to print out mechanism operation data having the same contents as those displayed on the image output unit 6.

When the above-mentioned apparatus for aiding mechanism design is used, labor and time required for the designer to design the mechanism can be reduced and shortened as compared with the method in which the designer determines on the design drawings.

However, the conventional apparatus for aiding mechanism design structured as described above suffers from the following problems.

That is, a final result of verification of the mechanism operation, which is, represented as data in a table cannot be used for only a considerably skilled designer to determine the result. Moreover, the structure in which the drive function, in which the mechanism operation and timing are described, is built in mechanism operation simulation data arises a problem in that the simulation of the operation of the mechanism intended to be performed in such a manner that the conditions are changed must be carried out in such a manner that all of mechanism operation simulation data items are prepared or the portions, in which the drive functions are described, are searched from the data file having a great volume so as to be changed. Thus, the working efficiency has been unsatisfactory.

SUMMARY OF THE INVENTION

Accordingly, an object of the present invention is to provide a method and an apparatus for aiding mechanism design which permit the mechanism operation and timing conditions to be changed easily and which enable a result of verification to be easily visually recognized and to easily understood.

According to one aspect of the present invention, there is provided an apparatus for aiding mechanism design such that mechanism design is aided by performing simulations of mechanism operations, comprising means for generating mechanism operation simulation data in accordance with predetermined data relating to a mechanism operation of a subject to be verified; means for generating a time chart of the mechanism operation of the subject to be verified in accordance with the generated mechanism operation simulation data; and means for displaying the generated time chart on a screen.

The apparatus for aiding mechanism design may further comprise means for permitting an operator to change setting of the time chart displayed on the screen. The apparatus for aiding mechanism design may further comprise means for storing predetermined information formed by causing at least a portion of the predetermined data to relate with the time chart; and means for automatically changing the predetermined data in synchronization with the change of the time chart in a case where the time chart displayed on the screen has been changed by the operator, by making a reference to the predetermined information.

In the apparatus for aiding mechanism design, the predetermined information may be formed by making drive function data of the subject to be verified to correspond to the time chart.

The apparatus for aiding mechanism design may further comprise means for executing the simulation of the operation of the mechanism of the subject to be verified simultaneously with displaying of the time chart. The apparatus for aiding mechanism design may further comprise means for automatically changing operation timing in the simulation of the operation of the mechanism in a case where the operator has changed the operation timing described in the time chart displayed on the screen, the automatic change being performed in synchronization with the change in the time chart.

According to another aspect of the present invention, there is provided an apparatus for aiding mechanism design such that mechanism design is aided by performing simulations of mechanism operations, comprising mechanism operation simulation data generating means for generating mechanism operation simulation data in accordance with machine constraint data of a subject to be verified; time chart generating means for generating a time chart in accordance with mechanism operation data, mechanism operation timing data and control delay data of each drive system of the subject to be verified; display means for displaying the time chart generated by the time chart generating means; drive function generating means for generating drive function data from the time chart generated by the time chart generating means; mechanism operation simulation execution means for executing the simulation of the operation of the mechanism by using mechanism operation simulation data obtained by the mechanism operation simulation data generating means and drive function data obtained by the drive function generating means; and time chart output means which converts mechanism operation data obtained from the mechanism operation simulation execution means into a time chart so as to display the time chart on the display means, the time chart being displayed as that after the simulation has been executed.

According to anther aspect of the present invention, there is provided an apparatus for aiding mechanism design such that mechanism design is aided by performing simulations of mechanism operations, comprising mechanism operation simulation data generating means for generating mechanism operation simulation data in accordance with machine constraint data of a subject to be verified; time chart generating means for generating a time chart in accordance with mechanism operation data, mechanism operation timing data and control delay data of each drive system of the subject to be verified; display means for displaying the time chart generated by the time chart generating means; drive function generating means for generating drive function data from the time chart generated by the time chart generating means; mechanism operation simulation execution means for executing the simulation of the operation of the mechanism by using mechanism operation simulation data obtained by the mechanism operation simulation data generating means and drive function data obtained by the drive function generating means; time chart output means which converts mechanism operation data obtained from the mechanism operation simulation execution means into a time chart so as to display the time chart on the display means, the time chart being displayed as that after the simulation has been executed; time chart changing means for, on the display screen, changing the time chart after the simulation which is displayed on the display means; and means for changing drive function data generated by the drive function generating means in accordance with data of the changed time chart.

According to another aspect of the present invention, there is provided a recording medium comprising a computer program recorded therein for aiding mechanism design by performing simulations of mechanism operations, the computer program being executed by the following steps of generating mechanism operation simulation data in accordance with predetermined data relating to a mechanism operation of a subject to be verified; generating a time chart of the mechanism operation of the subject to be verified in accordance with generated mechanism operation simulation data; storing predetermined information formed by causing at least a portion of the predetermined data to relate with the time chart; displaying the generated time chart on a screen; permitting an operator to change setting of the time chart displayed on the screen; and automatically changing the predetermined data in synchronization with the change of the time chart in a case where the time chart displayed on the screen has been changed by the operator, by making a reference to the predetermined information.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly

BRIEF DESCRIPTION OF THE DRAWINGS

The accompanying drawings, which are incorporated in and constitute a part of the specification, illustrate presently preferred embodiment of the present invention and, together with the general description given above and the detailed description of the preferred embodiment given below, serve to explain the principles of the present invention in which:

FIG. 4 is a time chart showing an example of mechanism operation data of each drive system and timing data of the mechanism operations supplied, in the form of a time chart, to the apparatus for aiding mechanism design according to the present invention;

FIG. 9 shows an example of the changed time chart in the apparatus for aiding mechanism design according to the present invention;

FIG. 11 is a diagram showing the mechanism system of a copying machine for use to explain an example of verification performed by the apparatus for aiding mechanism design according to the present invention; and FIG. 12 is a perspective view showing a computer for reading, from a recording medium, a computer program describing the procedure of the method of aiding mechanism design according to the present invention so as to execute the program.

DETAILED DESCRIPTION OF THE PREFERRED EMBODIMENTS

Figure 1:
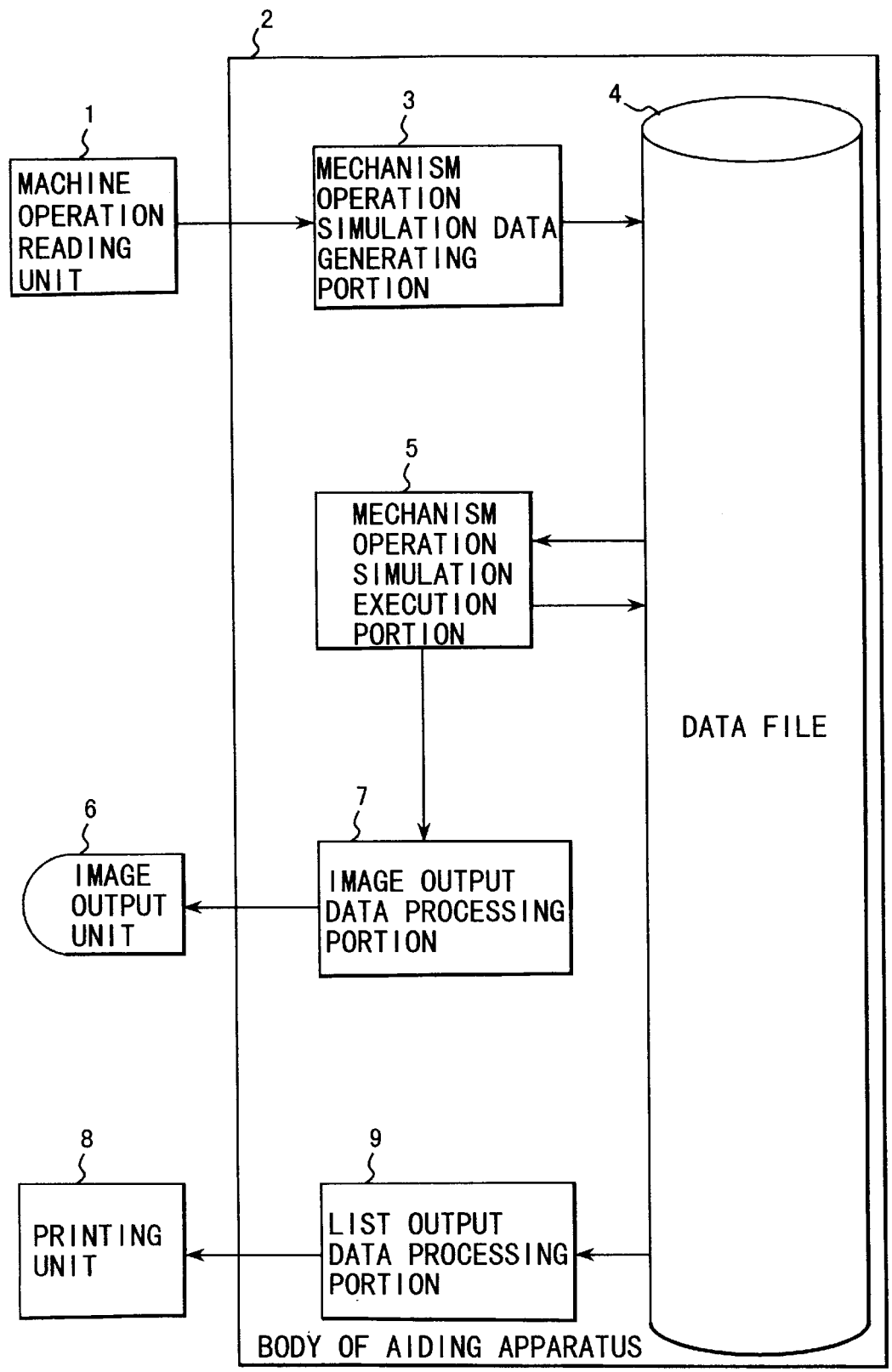
FIG. 1 is a block diagram showing a conventional apparatus for aiding mechanism design.
Figure 2:
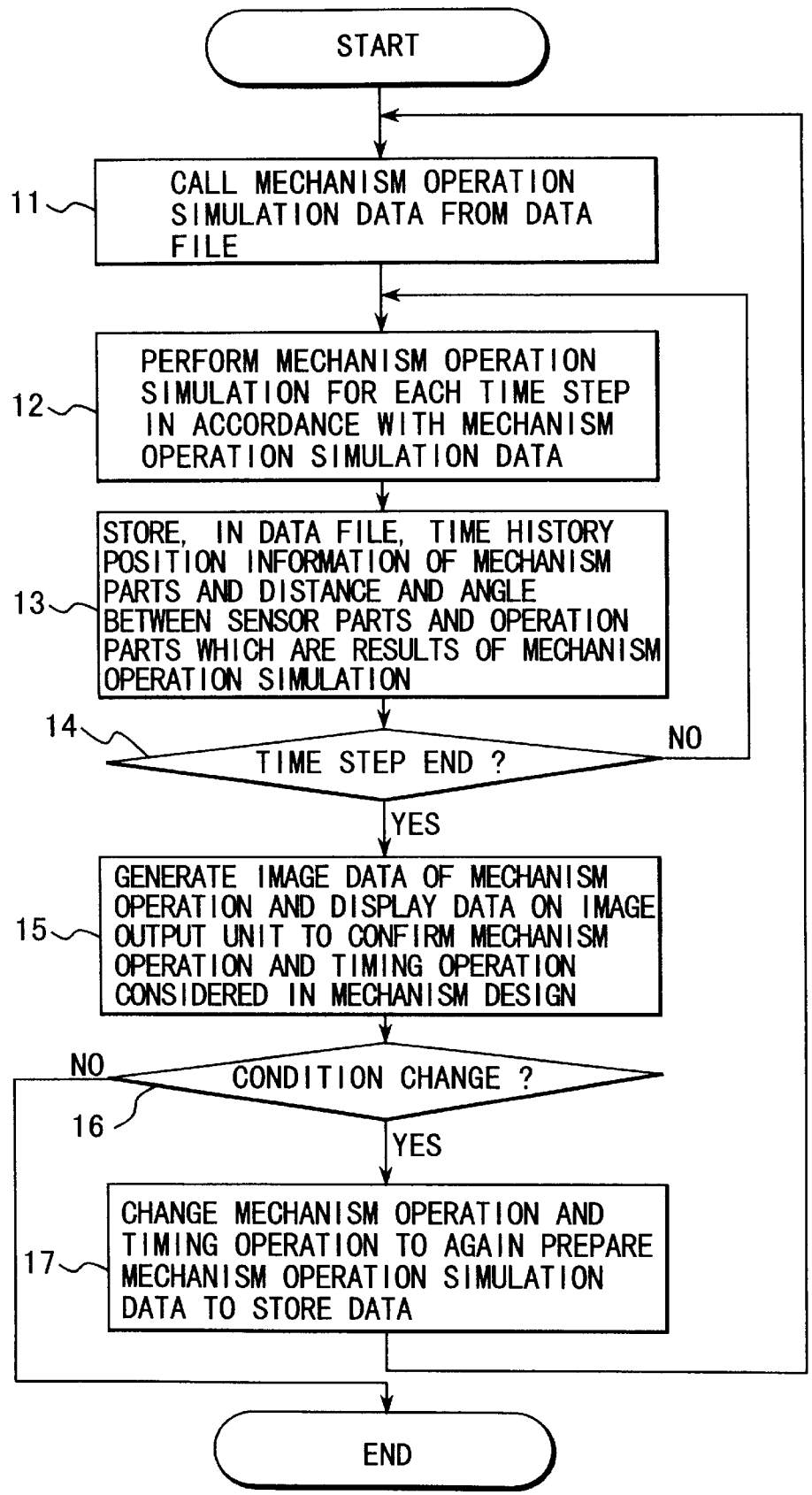
FIG. 2 is a flow chart of a verifying operation to be performed by the conventional apparatus for aiding mechanism design.

Referring to the drawings, preferred embodiment of the present invention will now be described.

Figure 3:
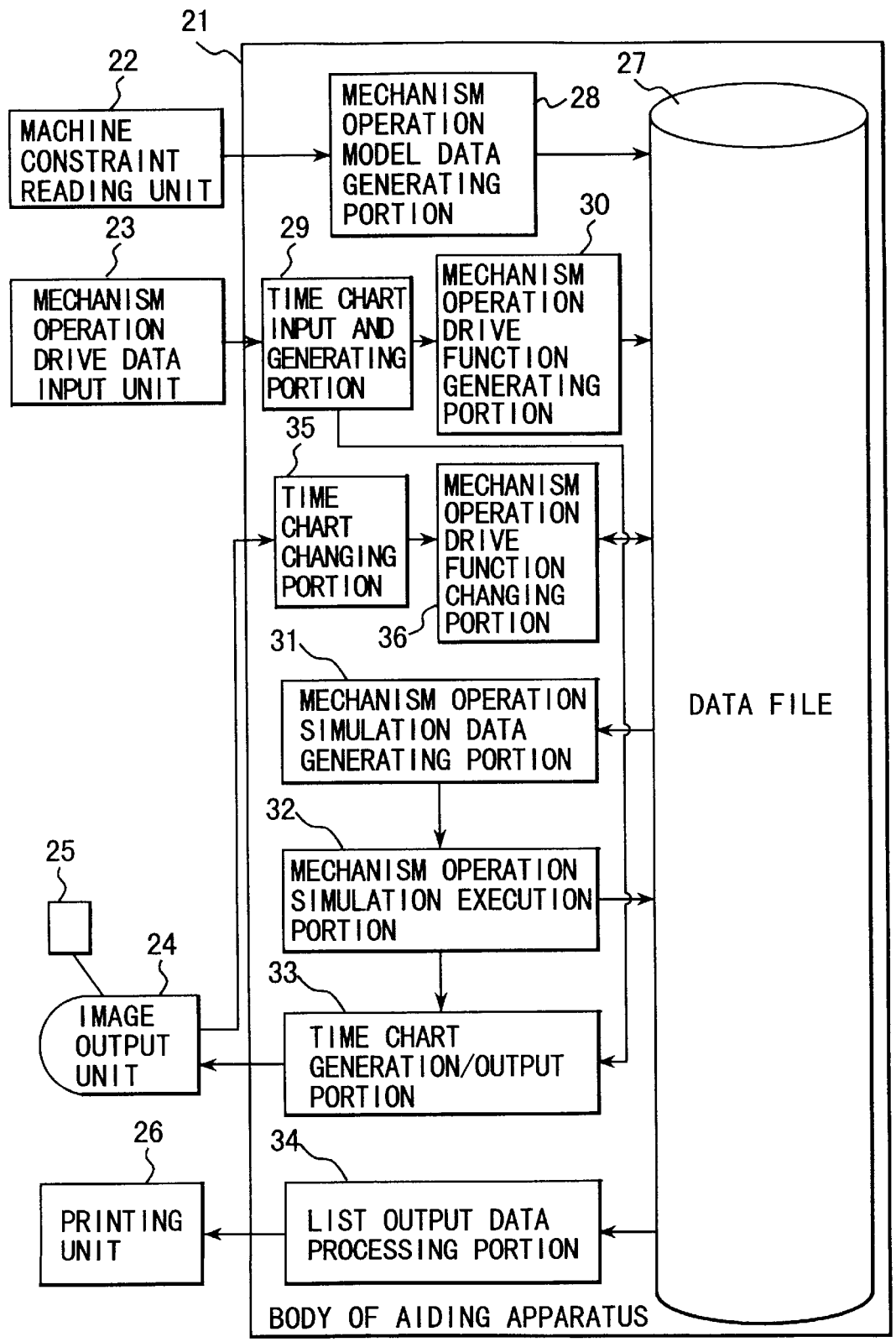
FIG. 3 is a block diagram showing the structure of an apparatus for aiding mechanism design according to an embodiment of the present invention.

FIG. 3 is a block diagram showing an apparatus for aiding mechanism design according to an embodiment of the present invention.

The apparatus for aiding mechanism design comprises a body 21 of the aiding apparatus, a machine constraint reading unit 22, a mechanism operation drive input unit 23 and an image output unit 24 connected to the body 21 of the aiding apparatus. Moreover, the apparatus for aiding mechanism design comprises an input device 25, such as a mouse and a keyboard, for performing a dialogue with the body 21 of the aiding apparatus through the image output unit 24 and a printing unit 26.

The body 21 of the aiding apparatus comprises: a data file 27; a mechanism operation model data generating portion 28 which generates mechanism operation model data in accordance with data supplied through the machine constraint reading unit 22 so as to store the generated data in the data file 27; a time chart input and generating portion 29 for generating time chart data in accordance with data supplied through the mechanism operation drive input unit 23, a mechanism operation drive function generating portion 30 which generates a mechanism operation drive function in accordance with generated time chart data to store the generated function in the data file 27; a mechanism operation simulation data generating portion 31 which reads, from the data file 27, mechanism operation model data and mechanism operation drive function data to generate mechanism operation simulation data; a mechanism operation simulation execution portion 32 for executing the simulation of the operation of the mechanism in accordance with simulation data; a time chart generating and output portion 33 which generates a time chart in accordance with a result of simulation and time chart data generated by the time chart input and generating portion 29 so as to output the time chart to the image output unit 24; a list output data processing portion 34 for, if necessary, outputting the time chart displayed on the image output unit 24 to the printing unit 26; a time chart changing portion 35 for changing the time chart when a command to change the time chart has been issued through the input device 25; and a mechanism operation drive function changing portion 36 which changes the mechanism operation drive function in accordance with the changed time chart to store new mechanism operation drive function into the data file 27.

An example of an operation to verify the mechanism operation of a copying machine 100 shown in FIG. 11 by using the apparatus for aiding mechanism design having the above-mentioned structure will now be described.

Initially, machine constraint data about the copying machine 100 is supplied to the mechanism operation model data generating portion 28 through the machine constraint reading unit 22.

Machine constraint data about the copying machine 100 is fixed data, such as data on the distance from the initial position of each section of the copying machine 100 to each sensor. The foregoing data items are supplied to follow a predetermined description format.

The mechanism operation model data generating portion 28 generates model data in accordance with supplied data to store generated data to the data file 27.

Then, mechanism operation data, drive data of the mechanism operation, timing operation data and control delay data are supplied to the time chart input and generating portion 29 through the mechanism operation drive input unit 23.

Mechanism operation data for the copying machine 100 is data indicating a fact that an image reading portion 101 is, by means of a belt, conveyed by a motor 102 for driving a belt for the image reading portion 101; that an image reading portion 101 reaches a sensor 103 for detecting completion of an image reading operation; that a white paper 104, on which no image has been copied, is, by means of a belt, conveyed by a motor 105 for driving a sheet feeding belt; the sheet, which is being conveyed, is extracted from the copying machine 100 as a copied sheet 112 through a toner adhesion portion 106, a sensor 107 for detecting a fact that the sheet has been conveyed to the toner adhesion completion position, a developing unit 108, sensor 109 for detecting a fact that the sheet has been conveyed to the fixing completion position, a fixing unit 110 and a sensor 111 for detecting a fact that the sheet has been conveyed to the development completion position; that the developing unit 108 and the fixing unit 110 are rotated by corresponding motors to perform development and fixing functions respectively; and that completion of the process to be performed by the toner adhesion portion 106 is confirmed by a sensor 112 for detecting completion of the toner adhesion process, completion of the process to be performed by the developing unit 108 is confirmed by a sensor 113 for detecting completion of the development process and completion of the fixing unit 110 is confirmed by a sensor 114 for detecting the fixing process.

Drive data on the mechanism operation in the copying machine 100 is data on the rotational speeds and acceleration/deceleration patterns of a motor 102 for driving the belt for the image reading portion 101, a motor 105 for driving the sheet feeding belt and motors respectively mounted on the developing unit 108 and the fixing unit 110, the acceleration/deceleration patterns being realized when the rotations of the motors are started and interrupted, respectively.

Data on the timing operation in the copying machine 100 is time sequential data on the relationship among completion timing of the operations for performing the functions of the copying machine 100. That is, the image reading portion 101 is, by the motor 102 for driving the belt for the image reading portion 101, conveyed by means of the belt while reading present image data so that the image reading portion 101 reaches the sensor 103 for detecting completion of an image reading operation. When the sensor 103 for detecting completion of an image reading operation has generated an output signal, the motor 102 for driving the belt for the image reading portion 101 is rotated reversely to restore the image reading portion 101 to the original position. Then, the motor 105 for driving the sheet feeding belt is rotated so that the white paper 104, on which no image has been copied, is conveyed by means of the belt. Thus, initially toner is allowed to adhere in the toner adhesion portion 106. The completion of the process is detected in accordance with a completion signal transmitted from the sensor 112 for detecting completion of the toner adhesion process and a fact that the sheet passes the sensor 107 for detecting the fact that the sheet has been conveyed to the toner adhesion completion position. When output signals have been generated from both of the sensor 112 for detecting completion of the toner adhesion process and the sensor 107 for detecting the fact that the sheet has been conveyed to the toner adhesion completion position, the motor for the developing unit 108 is rotated so that image data read by the image reading portion 101 is immediately transferred to the developing unit 108 and, thus, the copying operation is performed. The completion of the development process is detected in accordance with a completion signal transmitted from the sensor 113 for detecting completion of the development process and a fact that the sheet has passed the sensor 109 for detecting the fact that the sheet has been conveyed to the fixing completion position. When output signals have been generated from both of the sensor 113 for detecting completion of the development process and the sensor 109 for detecting the fact that the sheet has been conveyed to the fixing completion position, the motor for the fixing unit 110 is rotated so that the sheet, which has been conveyed, is subjected to the fixing process. Completion of the fixing process is detected in accordance with a completion signal transmitted from the sensor 114 for detecting the fixing process and a fact that the sheet has passed the sensor 111 for detecting the fact that the sheet has been conveyed to the development completion position. When output signals have been generated from both of the sensor 114 for detecting the fixing process and the sensor 111 for detecting the fact that the sheet has been conveyed to the development completion position, the copied sheet 112 is extracted from the copying machine 100. Moreover, the rotation of the motor 105 for driving the sheet feeding belt is interrupted.

Control delay data in the copying machine 100 is data of the designer obtained from experience, the control delay data including data on time delay taking place when a driver source, such as the motor, is turned on in response to the output signal from each sensor during the mechanism operation, delay of the timing of the process to which the sheet is subjected, and a delay taking place due to slippage of the sheet or the like when the sheet is conveyed by the belt.

Data of the foregoing type is supplied to the mechanism operation drive input unit 23 to conform to a predetermined description format or input format. The supplied data is, by the time chart input and generating portion 29, converted into data of a time chart as shown in FIG. 4 so as to be supplied to the mechanism operation drive function generating portion 30 and displayed on the image output unit 24.

The mechanism operation drive function generating portion 30 converts the supplied time chart data into a drive function to store the drive function into the data file 27.

The drive function for the copying machine 100 is formed by, as conditional statement, adding interruption of the operation and the control delay caused in response to the output signals from the sensor 103 for detecting completion of an image reading operation, the sensor 107 for detecting the fact that the sheet has been conveyed to the toner adhesion completion position, the sensor 109 for detecting the fact that the sheet has been conveyed to the fixing completion position, the sensor 111 for detecting the fact that the sheet has been conveyed to the development completion position, the sensor 112 for detecting completion of the toner adhesion process, the sensor 113 for detecting completion of the development process and the sensor 114 for detecting the fixing process to time functions expressing displacements of the motor 102 for driving the belt for the image reading portion 101, the motor 105 for driving the sheet feeding belt and the motors respectively mounted on the developing unit 108 and the fixing unit 110. That is, the drive function is a function expressing a state of an operation as the time elapses. For example, the drive function is a function having a value of zero when the operation is started, a negative value at a moment before the operation is started and a positive value at a moment after the operation has been started.

Figure 5:
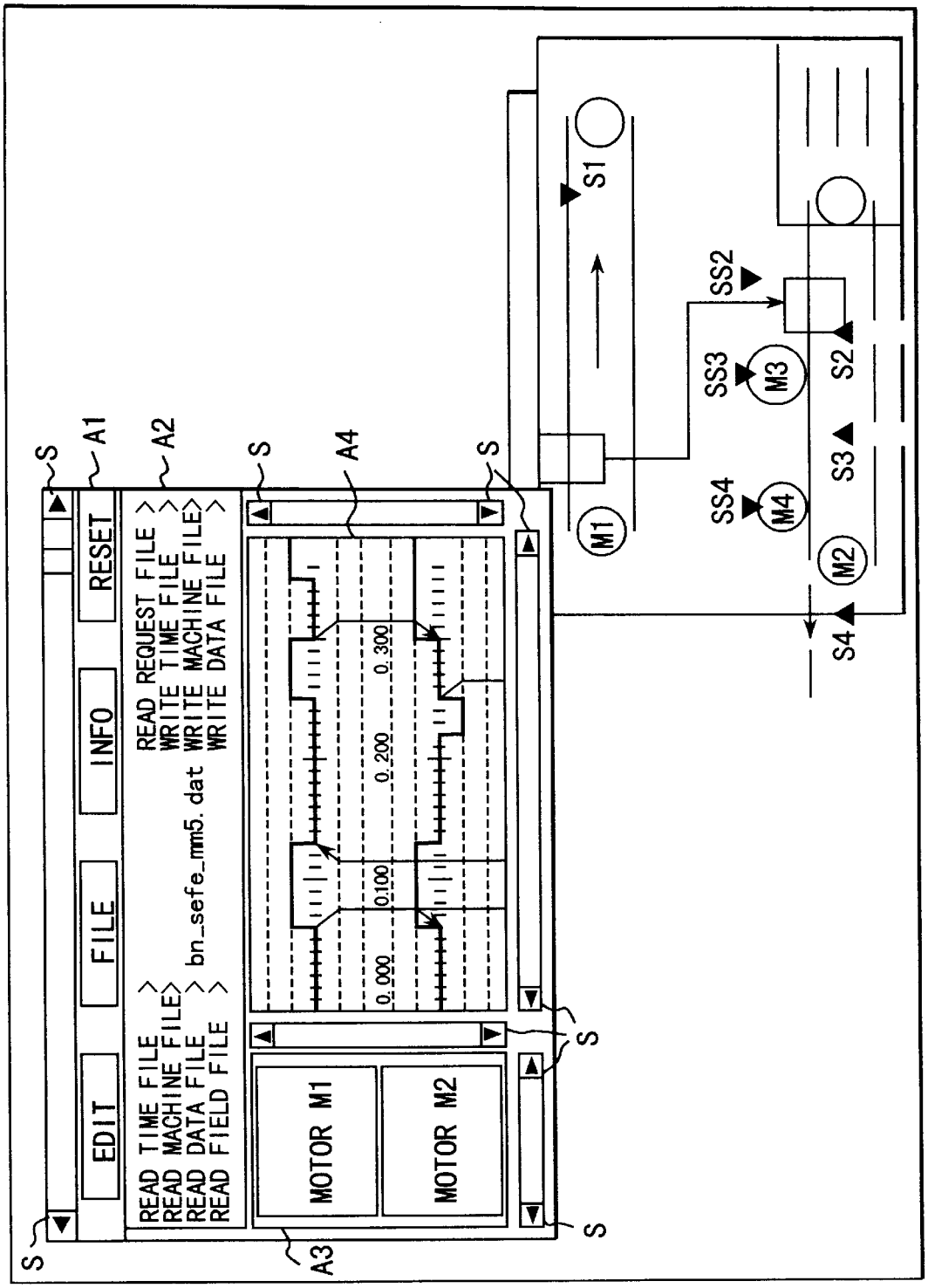
FIG. 5 is a diagram showing a state where the mechanism system and the time chart of a copying machine are displayed on a display screen of an image output unit provided for the apparatus for aiding mechanism design according to the present invention.

FIG. 5 shows a state where the mechanism system of the copying machine and a generated time chart are displayed on a display screen of the image output unit 24. In the illustrated example, a time chart screen is, in the form of a window, opened on a screen on which the mechanism system of the copying machine is graphically displayed.

Note that the mechanism system of the copying machine may be 3D graphically displayed to enable the operator to easily stereoscopically recognize the operation of each of the devices forming the mechanism system. Moreover, arbitrary change of the ratio of the size of the screen for displaying the time chart and that of the screen for displaying the mechanism system of the copying machine may be permitted.

The time chart screen has the following regions: region A1 in which various operation items are arranged to be selected, region A2 for reading a required file and inputting a variety of commands and the like, region A3 for sequentially arranging and displaying the names or codes of various devices, and region A4 for displaying time charts (uneven line patterns) respectively corresponding the various devices displayed in the region A3 and numerical parameters accompanying the time charts. Moreover, scroll bars S for vertical and horizontal scroll are provided for the respective regions to enable a hidden portion to be observed in each region.

The operator is able to generate/change the time chart by operating the input device 25 (a pointing device, such as a mouse, and a keyboard) on the time chart screen. In a case where the operator has shifted certain operation timing on a time chart for device MOTOR M1 for example on a time chart screen after the time chart has been generated, the operation timing of device MOTOR M1 displayed on the graphic screen for the mechanism system is automatically changed in synchronization with the shift performed by the operator.

Therefore, the operator is able to, on one display screen, confirm a state where the contents of change of the operation timing of each device are reflected on the graphic screen for the mechanism system. Thus, the operator is able to easily verify the mechanism operation.

Figure 6:
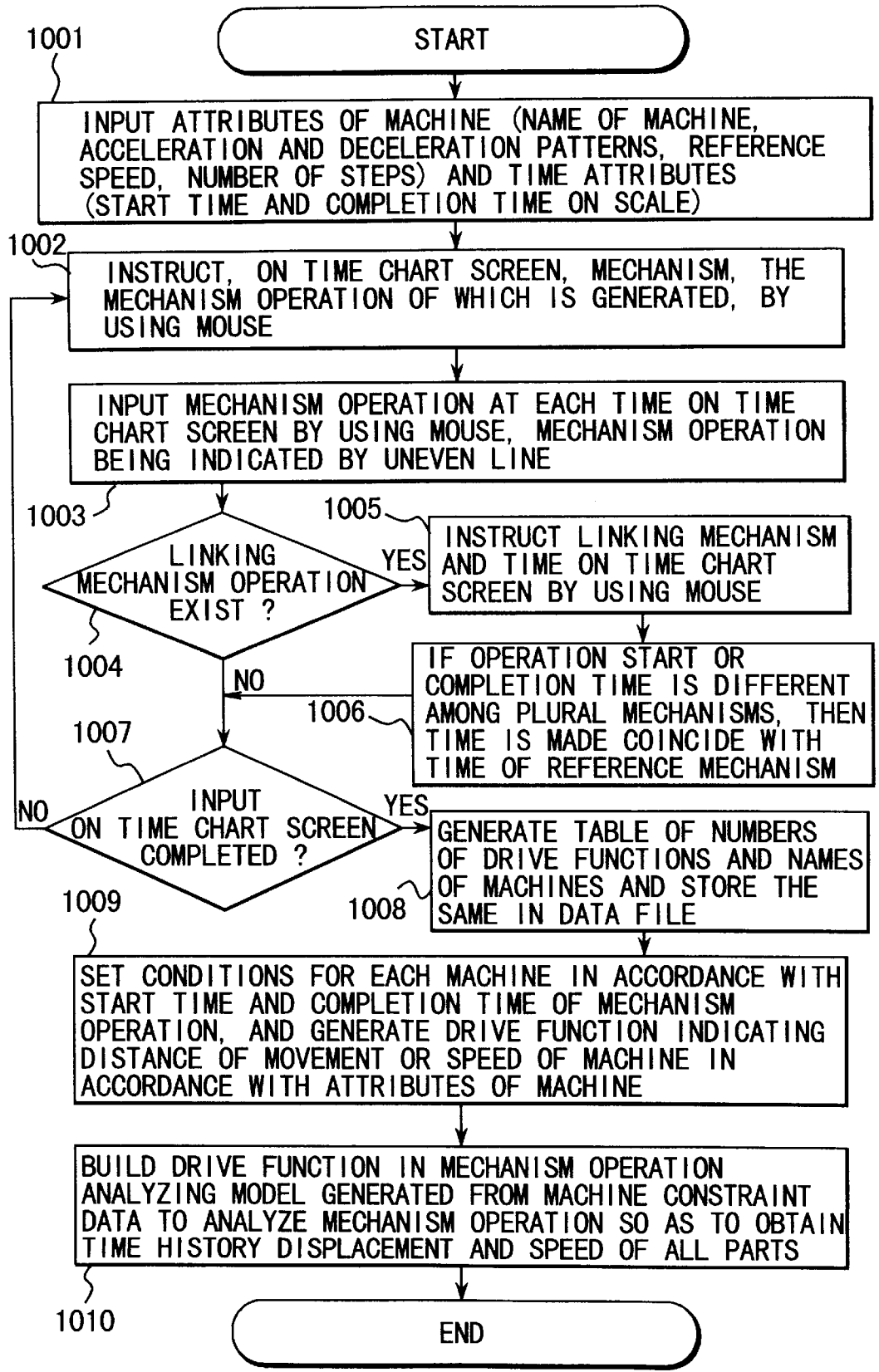
FIG. 6 is a flow chart of a process for generating, in the apparatus for aiding mechanism design according to the present invention, time chart data and a process for generating a drive function in accordance with the time chart data.

The procedures of the time chart input and generating portion 29 and the mechanism operation drive function generating portion 30 are shown in FIG. 6.

Initially, the attributes of the machines (names of the machines, acceleration/deceleration patterns, reference speed and the number of steps) and time attributes (start time and completion time on a scale) are supplied to the time chart screen (step 1001). Then, a mechanism, the mechanism operation of which is generated, is instructed on the time chart screen by using a mouse (step 1002). Then, the mechanism operation for each time is supplied on the time chart screen (step 1003). The mechanism operation is indicated by an uneven line. Then, whether linking mechanism operation exists is checked (step 1004). If a linking mechanism operation exists, the linking mechanism and the time are instructed by using the mouse on the time chart screen (step 1005). If the operation start or the completion time is different among a plurality of mechanisms, the time is made coincide with the time of the reference mechanism (step 1006). The foregoing operation is performed until the input on the time chart screen is completed (step 1007). When the operation has been completed, a table of the number of the drive function and the name of the machine is generated so as to be stored in the data file 27 (step 1008). Then, conditions for each machine are set in accordance with the start time and the completion time of the mechanism operation to generate, from the attributes of the machine, a drive function expressing the distance of movement or speed of the machine (step 1009). Then, the drive function is built in a mechanism operation analyzing model generated from the machine constraint data to analyze the mechanism operation so as to obtain the time history displacement and speed of all elements and store the same in the data file 27 (step 1010).

Figure 7:
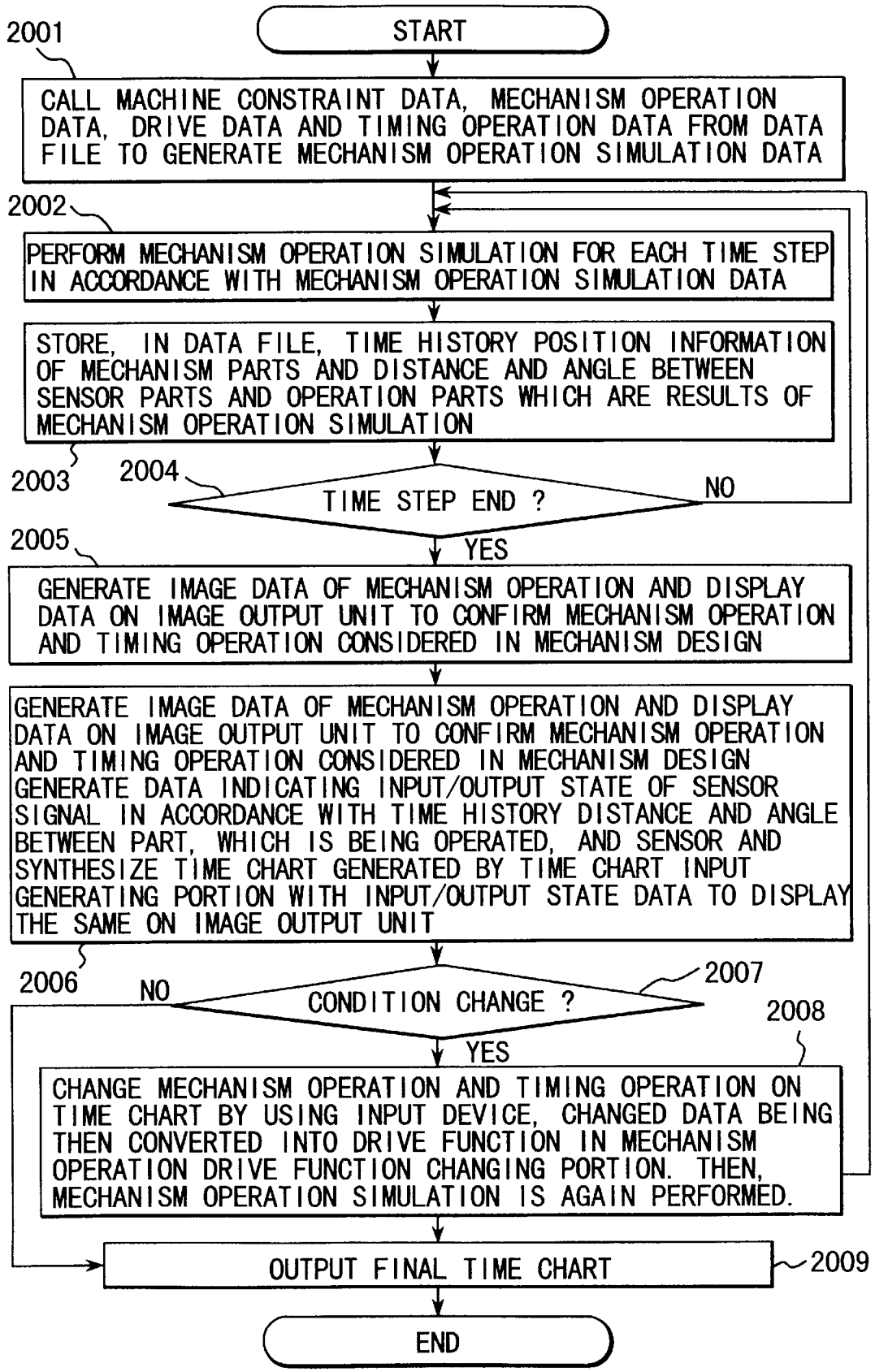
FIG. 7 is a flow chart of a verifying process to be performed in the apparatus for aiding mechanism design according to the present invention.

When an execution command is issued, the mechanism operation simulation data generating portion 31, as shown in FIG. 7, calls machine constraint data, mechanism operation data, drive data of the mechanism operation and timing operation data from the data file 27 to generate mechanism operation simulation data (step 2001). Then, the mechanism operation simulation execution portion 32 executes the simulation of the operation of the mechanism in accordance with the mechanism operation simulation data (step 2002).

At this time, time history position information, distance data and angle data between the sensor element and the operation element, which are results of the simulation of the operation of the mechanism, are stored in the data file 27 (step 2003). The results of the simulation of the operation of the mechanism of the copying machine 100 include time historical positions of the image reading portion 101 and the white paper 104 before copying, time historical position of the sensor 103 for detecting completion of an image reading operation and the image reading portion 101, the time historical distances between the white paper 104 before copying and the sensor 112 for detecting completion of the toner adhesion process, the sensor 113 for detecting completion of the development process and the sensor 112 for detecting the fact that the sheet has been conveyed to the development completion position and the time historical states of the sensor 112 for detecting completion of the toner adhesion process, the sensor 113 for detecting completion of the development process and the sensor 111 for detecting the fact that the sheet has been conveyed to the development completion position.

The simulation of the operation of the mechanism is repeated to the time at which the mechanism operation is completed and which has been instructed by the operator (step 2004). When the simulation of the operation of the mechanism to the completion time has been completed, image data of the mechanism operation is generated (step 2005). Then, input and output states of the sensor signal are generated in accordance with the time historical distance from the operation element and the sensor, and then synthesized with the time chart generated by the time chart input and generating portion 29 (step 2006) so as to be displayed on the image output unit 24. The process in step 2005 is performed by the time chart generating and output portion 33.

While observing the image on the image output unit 24, the operator confirms the mechanism operation and the timing operation considered during the mechanism design. When the operator has intended to again verify the mechanism design by changing the mechanism operation conditions and the conditions for the timing operation and an error process, such as the control delay (step 2007), the operator operates the input device 25 to directly operate the time chart displayed on the image output unit 24.

The changed time chart is, through the time chart changing portion 35, supplied to the mechanism operation drive function changing portion 36 so that the drive function is changed and stored in the data file 27 (step 2008). Then, the mechanism operation simulation data generating portion 31 calls, from the data file 27, machine constraint data, mechanism operation data after the change has been performed, drive data on the mechanism operation and timing operation data so that mechanism operation simulation data is generated. In accordance with mechanism operation simulation data, the mechanism operation simulation execution portion 9 again performs the simulation of the operation of the mechanism. A result of the simulation of the operation of the mechanism is displayed on the printing unit 26.

Figure 8:
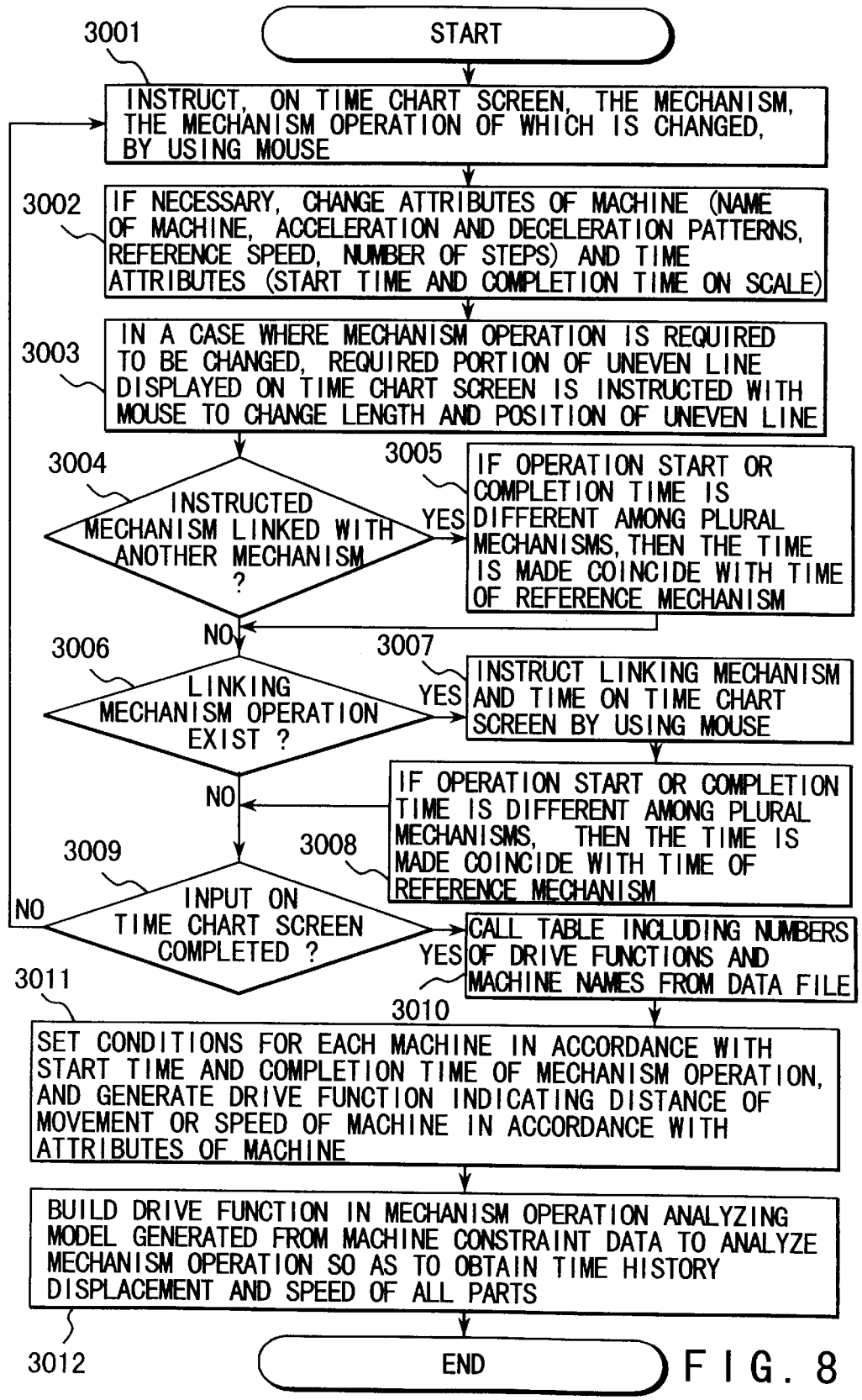
FIG. 8 is a flow chart of a process for changing the time chart and a process for changing the drive function in accordance with the changed time chart to be performed in the apparatus for aiding mechanism design according to the present invention.

FIG. 8 shows a process from change of the time chart displayed on the image output unit 24 to conversion of the changed time chart into the drive function by the mechanism operation drive function changing portion 36.

Initially, a mechanism, the mechanism operation of which is changed, is instructed on the time chart screen by using the mouse (step 3001). If necessary, the machine attributes (name of the machine, acceleration/deceleration patterns, reference speed and the number of steps) and the time attributes (the start time and the completion time on the scale) are changed on the time chart screen (step 3002).

In a case where the mechanism operation is needed to be changed, a required portion of the uneven line displayed on the time chart screen is instructed with the mouse or the like to change the length and position of the uneven line (step 3003). Then, whether a mechanism linking with the instructed mechanism exists is detected (step 3004). If a linking mechanism exists and if operation start time or the completion time is different among a plurality of mechanisms, the time is made coincide with the time of the reference mechanism (step 3005). Then, whether a linking mechanism operation exists is detected (step 3006). If a linking mechanism operation exists, the linking mechanism and the time are instructed on the time chart with the mouse (step 3007). If the operation start or completion time is different among the plural mechanisms, the time is made coincide with the time of the reference mechanism (step 3008).

After input on the time chart screen has been completed (step 3009), the table consisting of numbers of the drive functions and names of machines is called from the data file 27 (step 3010). Then, the conditions are set in accordance with the start time and the completion time of the mechanism operation for each machine, and a drive function expressing the distance of movement or speed of the unit is generated in accordance with the attributes of the units (step 3011). Then, the drive function is built in the mechanism operation analyzing model generated from machine constraint data to analyze the mechanism operation so as to obtain the time historical displacement and the speed of all of the elements and store the obtained data (step 3012).

A case of the modification of the time chart such that the conveyance speed realized by the motor 105 for driving the sheet feeding belt is duplicated will now be described.

When the rotational speed of the motor 105 for driving the sheet feeding belt is duplicated in the time chart, the output timing of each of the sensor 107 for detecting the fact that the sheet has been conveyed to the toner adhesion completion position, the sensor 109 for detecting the fact that the sheet has been conveyed to the fixing completion position and the sensor 111 for detecting the fact that the sheet has been conveyed to the development completion position, which are operated in synchronization with the conveyance of the paper, are advanced. The start of the toner adhesion process is not changed because the process is performed in response to the output signal from the sensor 103 for detecting completion of an image reading operation. However, the operation timing of each of the development process, which is started in response to the output signals from both of the sensor 107 for detecting the fact that the sheet has been conveyed to the toner adhesion completion position and the sensor 112 for detecting completion of the toner adhesion process, and that of the fixing process, which is started in response to the output signals from both of the sensor 113 for detecting completion of the development process and the sensor 109 for detecting the fact that the sheet has been conveyed to the fixing completion position, are changed in accordance with the conditions of linking.

The changed time chart is shown in FIG. 9. When the time chart is converted into a drive function to analyze the mechanism operation so as to confirm the image of the mechanism operation, the conveyance of the paper and processes of the sections and the motor rotations are shifted in timing. Thus, it can be detected that the apparatus cannot be operated satisfactorily.

Figure 10:
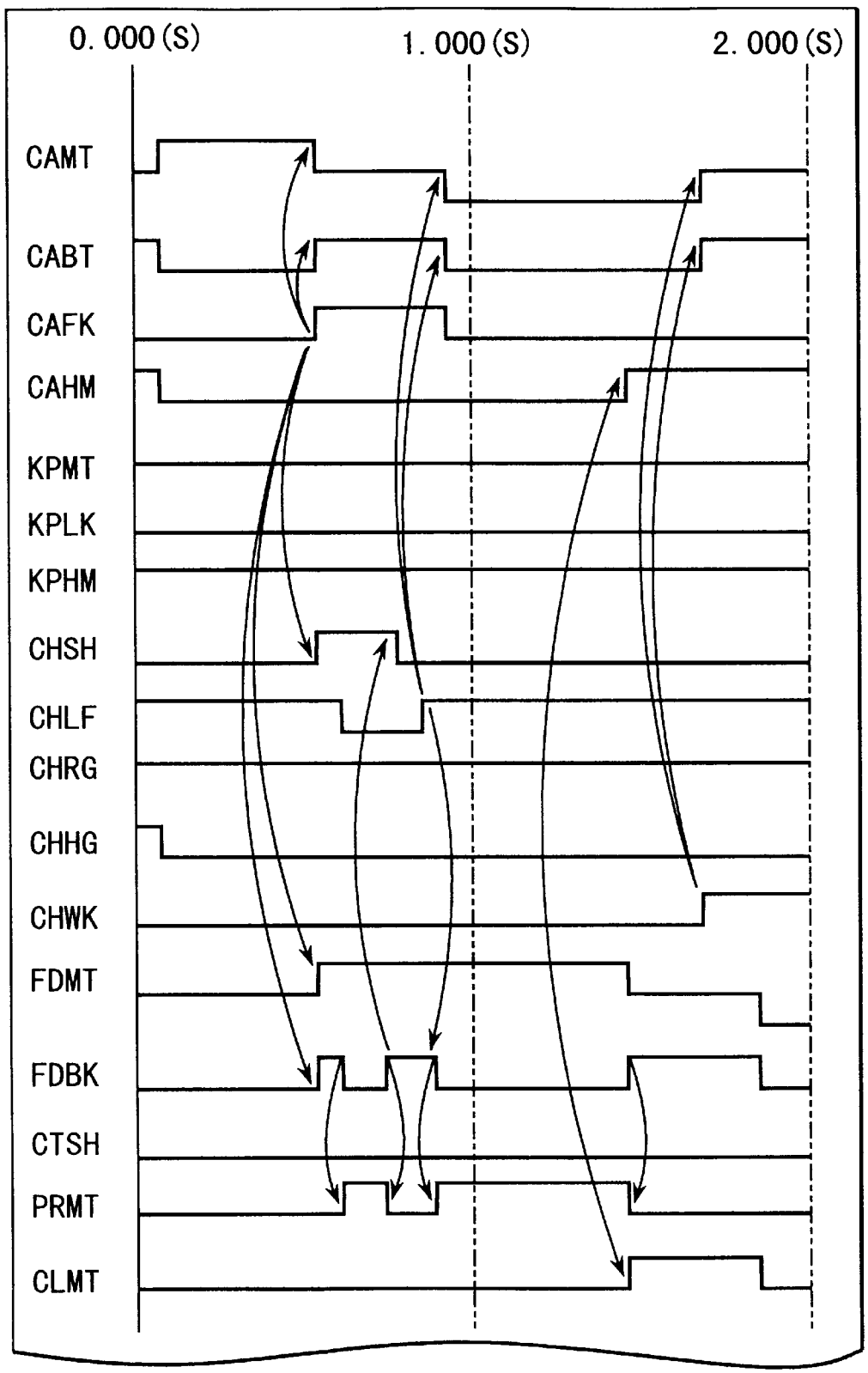
FIG. 10 shows examples of verification data printed out from the apparatus for aiding mechanism design according to the present invention.

The foregoing operation is repeated until the operator satisfies the result. In a case where the conditions are not changed, a time chart as shown in FIG. 10 is generated by the list output data processing portion 34 in the process shown in FIG. 7 so as to be printed out by the printing unit 26 (step 2009).

Therefore, when the apparatus according to the present invention is adapted to the copying machine 100, a mechanism operation free from shift of copying, contamination and paper jam can be produced. Thus, a result of the simulation is needed to be fed back to an actual product.

As described above, the operation and timing of each unit forming the mechanism system are, in the form of the time chart, displayed on the display screen. Data described on the time chart is converted into the drive function of the simulation of the operation of the mechanism so as to be stored. In a case where the mechanism operation conditions and timing conditions are intended to be changed, the operation for changing the time chart displayed on the screen performed by the operator causes the data on the drive function of the simulation of the operation of the mechanism to be automatically changed and stored in synchronization with the change of the time chart.

Therefore, even if the mechanism operation conditions or the timing conditions are changed, the necessity of again generating all data items and searching, among the data file having a great volume, the portions, in which the drive functions are described, to change the same can be eliminated. Only by changing the time chart, complicated conditions, such as the control delay, can easily be introduced to perform verification. Therefore, the mechanism design can efficiently be performed to be adaptable to the actual conditions after sufficient investigation has been performed.

Although the foregoing embodiment has been described mainly about the verification of the timing of the mechanism operation, data on the shapes of the elements may be added to the mechanism operation analyzing simulation to enable judgment of interference of elements to be performed.

As described above, according to the present invention, the operation and timing of each of the units forming the mechanism system are, in the form of the time chart, displayed on the display screen. Data described in the time chart is converted into the drive function of the simulation of the operation of the mechanism, and then stored. Moreover, the mechanism operation conditions and timing conditions can easily be changed by changing the time chart on the display screen. Therefore, the labor required to change the mechanism operation and the timing can significantly be reduced. Since the result of the verification is displayed in the form of the time chart, the mechanism design which can easily visually be recognized and which exhibits excellent efficiency, can be performed.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, a structure may be employed, as shown in FIG. 12 in which a software program describing the procedure of the process of the method of aiding mechanism design according to the present invention is stored in a recording medium R so as to be read and executed by an information processing apparatus, such as a computer or a work station.

What is claimed is:

1. A method of aiding mechanism design by performing simulations of mechanism operations, comprising the steps of:

generating mechanism operation simulation data in accordance with predetermined data relating to a mechanism operation of a subject to be verified;

generating a time chart of the mechanism operation of the subject to be verified in accordance with generated mechanism operation simulation data;

displaying the generated time chart on a screen; and permitting an operator to change setting of the time chart displayed on the screen.

2. A method according to claim 1, further comprising the steps of:

storing predetermined information formed by causing at least a portion of the predetermined data to relate with the time chart; and automatically changing the predetermined data in synchronization with the change of the time chart in a case where the time chart displayed on the screen has been changed by the operator, by making a reference to the predetermined information.

3. A method according to claim 2, wherein the predetermined information is formed by making drive function data of the subject to be verified to correspond to the time chart.

4. A method according to claim 1, further comprising the step of:
   executing the simulation of the operation of the mechanism of the subject to be verified simultaneously with displaying of the time chart.

5. A method according to claim 4, further comprising the step of:
   automatically changing operation timing in the simulation of the operation of the mechanism in a case where the operator has changed the operation timing described in the time chart displayed on the screen, the automatic change being performed in synchronization with the change in the time chart.

6. An apparatus for aiding mechanism design by performing simulations of mechanism operations, comprising:
   means for generating mechanism operation simulation data in accordance with predetermined data relating to a mechanism operation of a subject to be verified;
   means for generating a time chart of the mechanism operation of the subject to be verified in accordance with the generated mechanism operation simulation data;
   means for displaying the generated time chart on a screen; and
   means for permitting an operator to change setting of the time chart displayed on the screen.

7. An apparatus according to claim 6, further comprising:
   means for storing predetermined information formed by causing at least a portion of the predetermined data to relate with the time chart; and
   means for automatically changing the predetermined data in synchronization with the change of the time chart in a case where the time chart displayed on the screen has been changed by the operator, by making a reference to the predetermined information.

8. An apparatus according to claim 7, wherein the predetermined information is formed by making drive function data of the subject to be verified to correspond to the time chart.

9. An apparatus according to claim 6, further comprising:
   means for executing the simulation of the operation of the mechanism of the subject to be verified simultaneously with displaying of the time chart.

10. An apparatus according to claim 9, further comprising:
    means for automatically changing operation timing in the simulation of the operation of the mechanism in a case where the operator has changed the operation timing described in the time chart displayed on the screen, the automatic change being performed in synchronization with the change in the time chart.

11. An apparatus for aiding mechanism design such that mechanism design is aided by performing simulations of mechanism operations, comprising:
    mechanism operation simulation data generating means for generating mechanism operation simulation data in accordance with machine constraint data of a subject to be verified;
    time chart generating means for generating a time chart in accordance with mechanism operation data, mechanism operation timing data and control delay data of each drive system of the subject to be verified;
    display means for displaying the time chart generated by said time chart generating means;
    drive function generating means for generating drive function data from the time chart generated by said time chart generating means;
    mechanism operation simulation execution means for executing the simulation of the operation of the mechanism by using mechanism operation simulation data obtained by said mechanism operation simulation data generating means and drive function data obtained by said drive function generating means; and
    time chart output means which converts mechanism operation data obtained from said mechanism operation simulation execution means into a time chart so as to display the time chart on said display means, the time chart being displayed as that after the simulation has been executed.

12. An apparatus for aiding mechanism design such that mechanism design is aided by performing simulations of mechanism operations, comprising:
    mechanism operation simulation data generating means for generating mechanism operation simulation data in accordance with machine constraint data of a subject to be verified;
    time chart generating means for generating a time chart in accordance with mechanism operation data, mechanism operation timing data and control delay data of each drive system of the subject to be verified;
    display means for displaying the time chart generated by said time chart generating means;
    drive function generating means for generating drive function data from the time chart generated by said time chart generating means;
    mechanism operation simulation execution means for executing the simulation of the operation of the mechanism by using mechanism operation simulation data obtained by said mechanism operation simulation data generating means and drive function data obtained by said drive function generating means;
    time chart output means which converts mechanism operation data obtained from said mechanism operation simulation execution means into a time chart so as to display the time chart on said display means, the time chart being displayed as that after the simulation has been executed;
    time chart changing means for, on the display screen, changing the time chart after the simulation which is displayed on said display means; and
    means for changing drive function data generated by said drive function generating means in accordance with data of the changed time chart.

13. A recording medium having a computer program recorded therein for aiding mechanism design by performing simulations of mechanism operations, said computer program being executed by the following steps of:
    generating mechanism operation simulation data in accordance with predetermined data relating to a mechanism operation of a subject to be verified;
    generating a time chart of the mechanism operation of the subject to be verified in accordance with generated mechanism operation simulation data;
    storing predetermined information formed by causing at least a portion of the predetermined data to relate with the time chart;

displaying the generated time chart on a screen;

permitting an operator to change setting of the time chart displayed on the screen; and automatically changing the predetermined data in synchronization with the change of the time chart in a case where the time chart displayed on the screen has been changed by the operator, by making a reference to the predetermined information.

* * * * *